(12) United States Patent
Chen

(10) Patent No.: US 6,282,083 B1
(45) Date of Patent: Aug. 28, 2001

(54) COMPUTER MAINFRAME AND STAND ARRANGEMENT

(75) Inventor: Chih-Yoe Chen, Taoyuan Hsien (TW)

(73) Assignee: Enlight Corporation, Taoyuam Hsien (TW)

( * ) Notice: Subject to any disclaimer, the term of this patent is extended or adjusted under 35 U.S.C. 154(b) by 0 days.

(21) Appl. No.: 09/628,443

(22) Filed: Jul. 28, 2000

(51) Int. Cl.[7] .................................................... H05K 5/00
(52) U.S. Cl. .................... 361/681; 361/683; 361/685; 361/759; 361/831; 439/76.1
(58) Field of Search .................................. 361/680–688, 361/752, 753, 759, 831; 439/76.1

(56) References Cited

U.S. PATENT DOCUMENTS

| | | | |
|---|---|---|---|
| 5,257,164 | * | 10/1993 | Perez et al. ............................ 361/395 |
| 5,488,537 | * | 1/1996 | Headld et al. ......................... 361/684 |
| 5,786,983 | * | 7/1998 | Brenner et al. ....................... 361/680 |
| 6,049,813 | * | 4/2000 | Danielson et al. .................... 708/100 |
| 6,101,087 | * | 8/2000 | Sutton et al. ......................... 361/686 |

* cited by examiner

Primary Examiner—Jeffrey Gaffin
Assistant Examiner—Tuan Dinh
(74) Attorney, Agent, or Firm—Dougherty & Troxell

(57) ABSTRACT

A computer mainframe and stand arrangement includes a stand and a computer mainframe supported on the stand, wherein the stand has an oblique front panel and an oblique riser rose behind the front panel, the riser having a plurality of air vents and coupling holes; the computer mainframe is supported on the riser above the front panel of the stand, having a substantially U-shaped, fixed handle, a holding space defined between the handle and a front side wall thereof and adapted for holding case-packed computer readable disks on the front panel of the stand above a stop block at the front panel, and a plurality of coupling rods raised from a back side wall thereof and respectively coupled to the coupling holes of the stand.

3 Claims, 5 Drawing Sheets

COMPUTER MAINFRAME AND STAND ARRANGEMENT

BACKGROUND OF THE INVENTION

The present invention relates to a computer mainframe and stand arrangement, and more particularly to such a computer mainframe and stand arrangement in which the computer mainframe has a handle defining with a front side wall of the computer mainframe a holding space adapted for holding things on a front panel of the stand above a stop block at the front panel.

A computer may be used with disks for storing data, or controlled to run a compact disk, VCD or DVD. Regular computer readable disks may be individually packed in a case. In order to store case-packed computer readable disks, disk storage means may be used. However, it requires much table space to hold disk storage means on the table near the computer.

SUMMARY OF THE INVENTION

The invention has been accomplished to provide a computer mainframe and stand arrangement, which provides a storage space for holding case-packed computer readable disks. According to one aspect of the present invention, the computer mainframe and stand arrangement comprises a stand, and a computer mainframe supported on the stand. The stand has an oblique front panel and an oblique riser rose behind the front panel. The riser has a plurality of coupling holes. The computer mainframe is supported on the riser above the front panel of the stand, having a substantially U-shaped, fixed handle, a holding space defined between the handle and a front side wall thereof and adapted for holding case-packed computer readable disks on the front panel of the stand above a stop block at the front panel, and a plurality of coupling rods raised from a back side wall thereof and respectively coupled to the coupling holes of the stand. According to another aspect of the present invention, the coupling holes of the stand each are formed of a round hole and an elongated positioning hole downwardly extended from the round hole, and the coupling rods of the computer mainframe each have a neck adapted for engaging into the elongated positioning holes of the coupling holes after insertion of the coupling rods into the round holes of the coupling holes.

DETAILED DESCRIPTION OF THE PREFERRED EMBODIMENT

Figure 1:
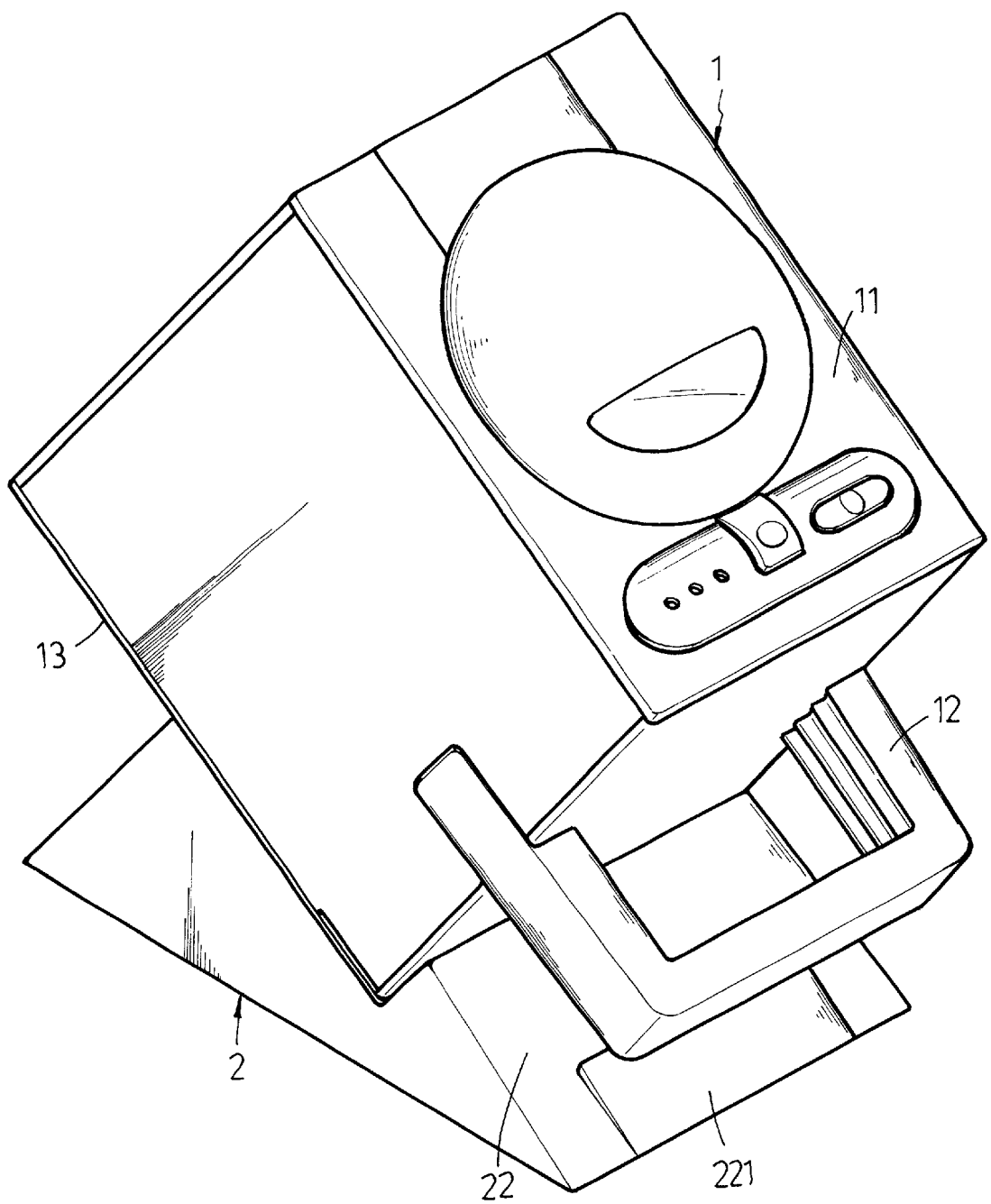
FIG. 1 is an elevational view of the present invention.
Figure 2:
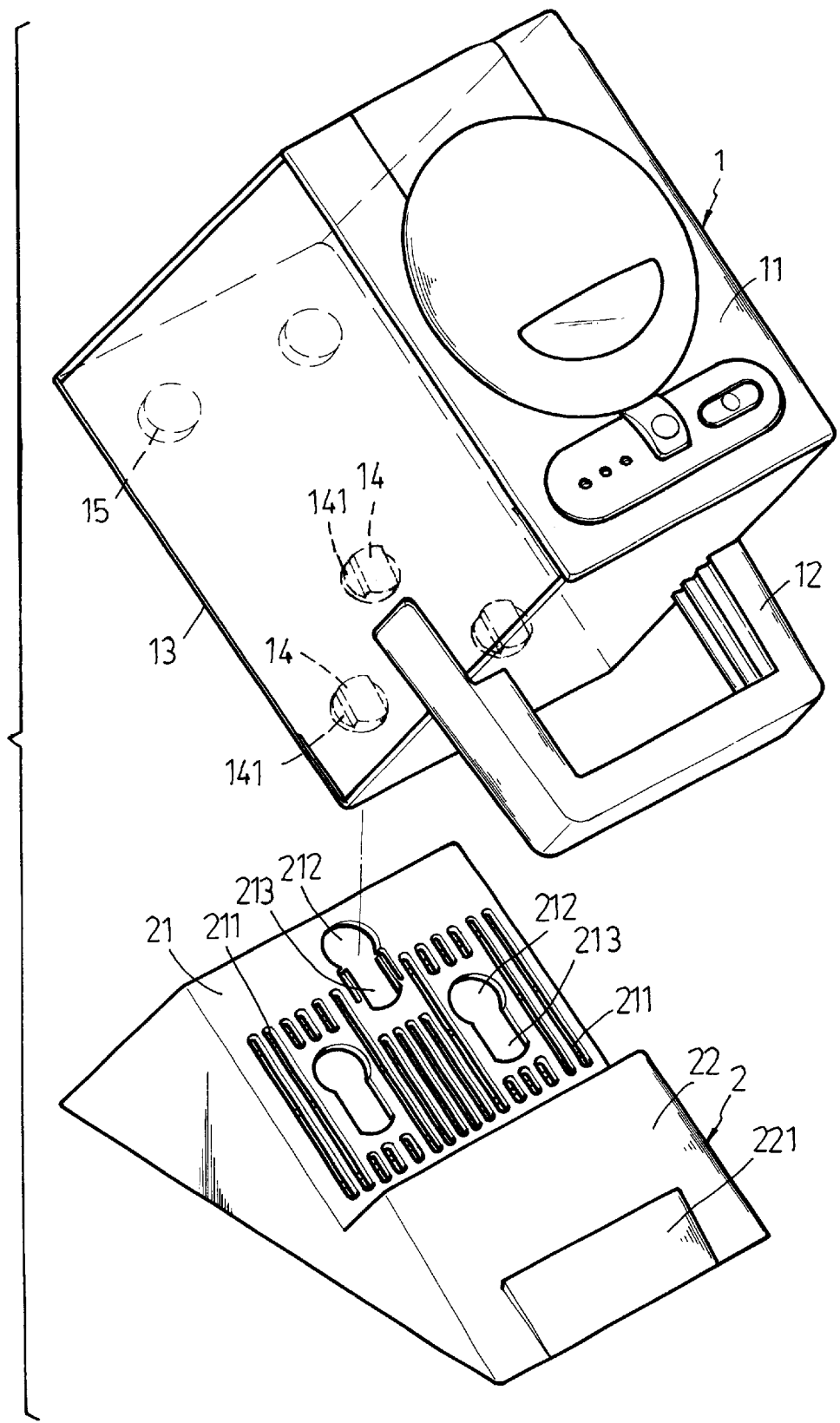
FIG. 2 shows the computer mainframe detached from the stand according to the present invention.

Referring to FIGS. 1 and 2, the present invention comprises a computer mainframe 1, and a stand 2. The computer mainframe 1 comprises a face panel 11 at the top side thereof, a substantially U-shaped handle 12 fixedly disposed at the front side thereof, and a plurality of foot members 15 and coupling rods 14 respectively raised from the back side wall 13 thereof. The coupling rods 14 each have a neck 141. The handle 12 is a substantially U-shaped member having two distal ends respectively fixedly fastened to two opposite lateral side walls of the computer mainframe 1, defining with the front side wall of the computer mainframe 1 a receiving space. The stand 2 comprises a front panel 22 obliquely backwardly sloping at the front side thereof, a riser 21 rose behind the front panel 22 and sloping in same direction, a stop block 221 integral with the front panel 22 at a bottom side, a plurality of air vents 211 through the raiser 21, a plurality of round holes 212 respectively formed on the riser 21 corresponding to the coupling rods 14 of the computer mainframe 1, and a plurality of elongated positioning holes 213 formed on the riser 21 and respectively downwardly extended from the round holes 212.

Figure 3:
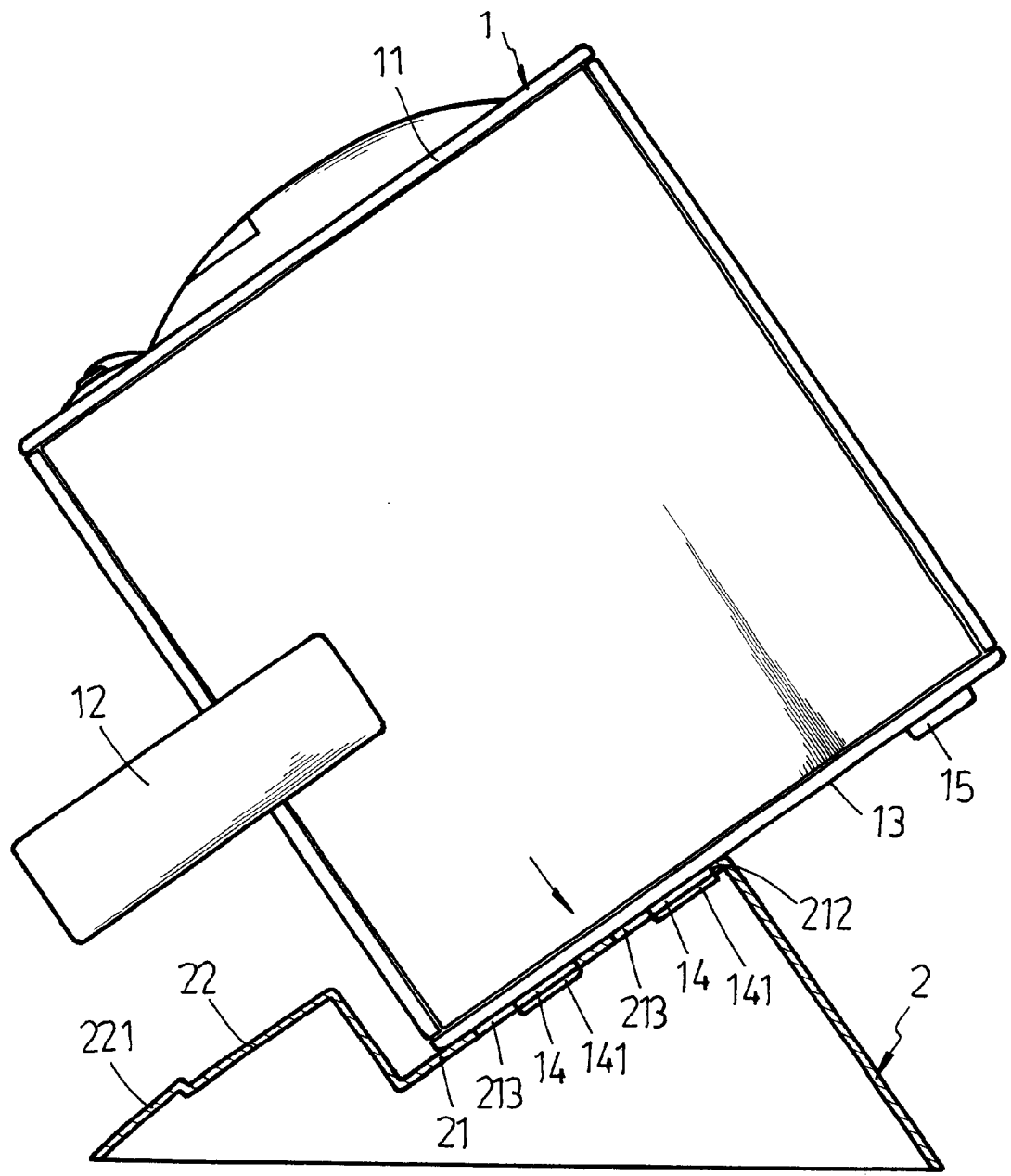
FIG. 3 is an installed view showing the coupling rods of the computer mainframe respectively inserted into the round holes of the stand according to the present invention.
Figure 5:
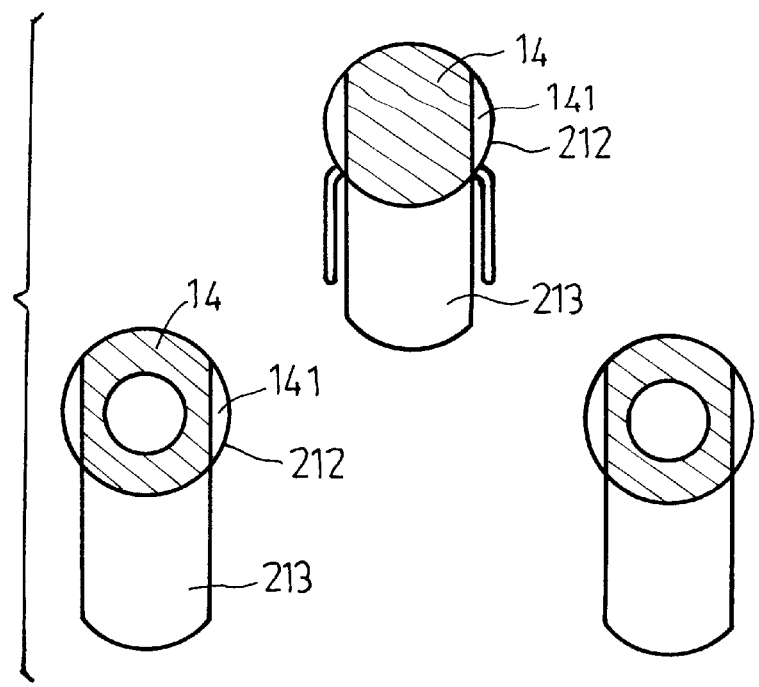
FIG. 5 is a schematic drawing showing the coupling rods inserted into the respective round holes according to the present invention.
Figure 6:
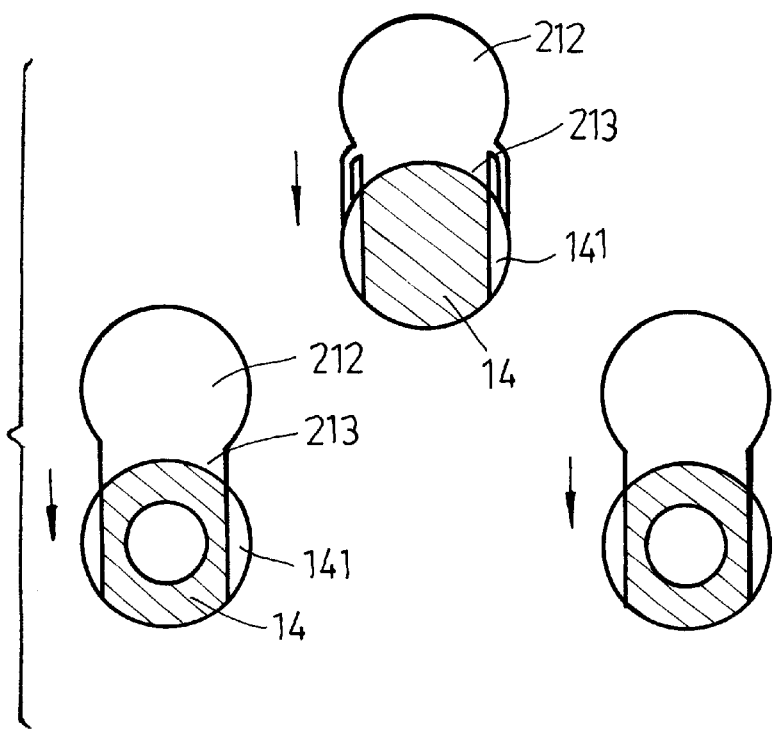
FIG. 6 is a schematic drawing showing the coupling rods moved downwards from the respective round holes and engaged into the respective elongated positioning holes according to the present invention.

Referring to FIGS. 3, 5 and 6, and FIG. 2 again, when mounting the computer mainframe 1 on the stand 2, the coupling rods 14 of the computer mainframe 1 are respectively inserted into the round holes 212 on the riser 21 of the stand 2 (see FIG. 3), and then the computer mainframe 1 is moved downwards along the riser 21 to force the neck 141 of each coupling rod 14 into engagement with the elongated positioning holes 213 respectively, enabling the bottom side wall of the computer mainframe 1 to be supported on the tread connected between the riser 21 and the front panel 22. During the operation of the computer mainframe 1, heat can be dissipated from the computer mainframe 1 into the air through the air vents 211.

Figure 4:
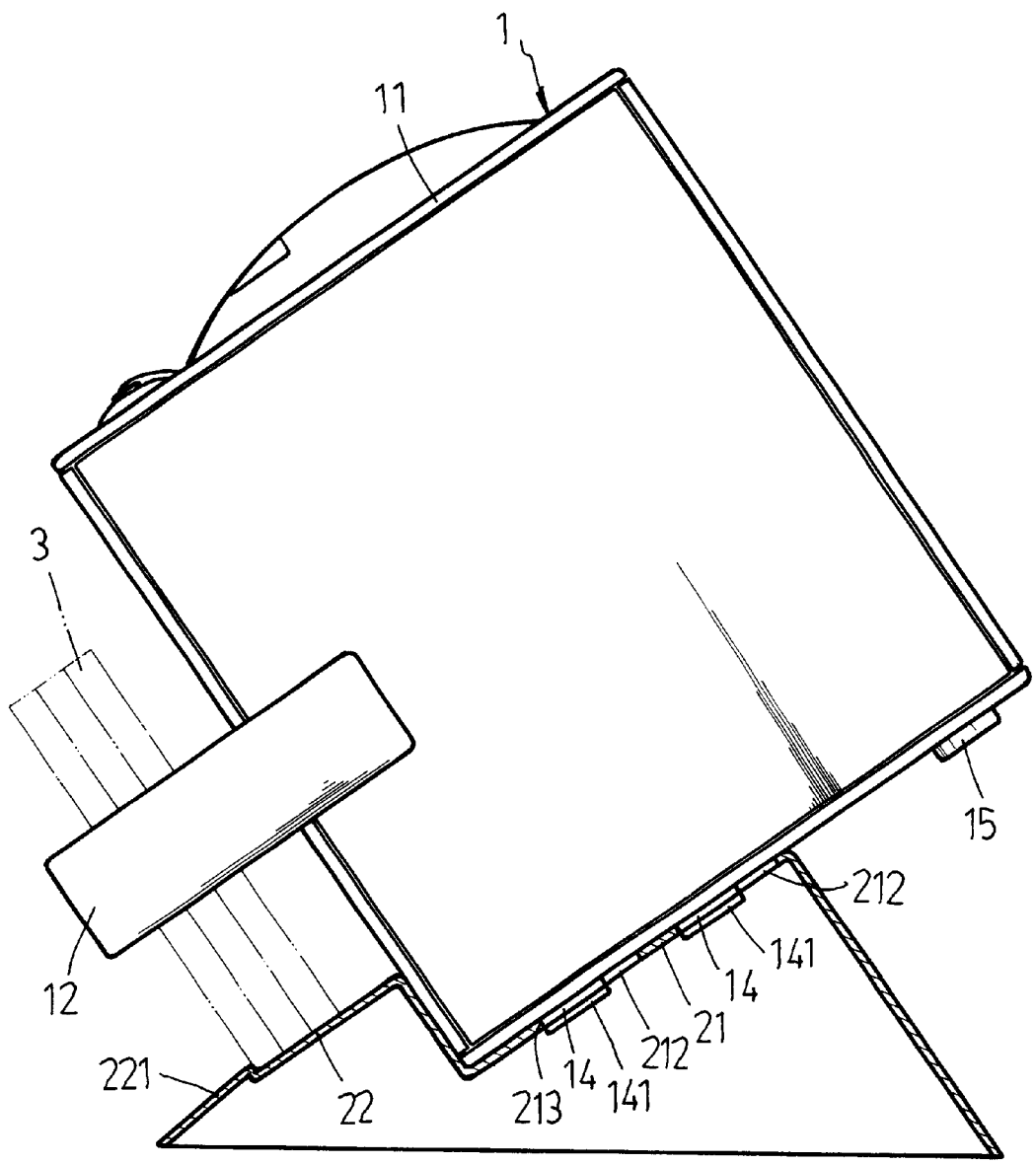
FIG. 4 is a sectional view showing the computer mainframe installed in the stand, DVD cases stored in the space defined between the handle and the front side wall of the computer mainframe and supported on the face panel of the stand above the stop block.

Referring to FIG. 4, after installation of the computer mainframe 1 in the stand 2, CD, VCD or DVD cases 3 can be stored in the space defined between the handle 12 and the front side wall of the computer mainframe 1, and supported on the front panel 22 of the stand 2 above the stop block 221.

While only one embodiment of the present invention has been shown and described, it will be understood that various modifications and changes could be made thereunto without departing from the spirit and scope of the invention disclosed.

What the invention claimed is:

1. A computer mainframe and stand arrangement comprising a stand, and a computer mainframe supported on said stand, wherein said stand comprises a front panel obliquely backwardly sloping at the front side thereof, a riser rose behind said front panel and sloping in same direction, a stop block integral with said front panel at a bottom side, and a plurality of coupling holes respectively formed on said riser; said computer mainframe is supported on said riser above the front panel of said stand, comprising a substantially U-shaped, fixed handle, a holding space defined between said handle and a front side wall thereof and adapted for holding case-packed computer readable disks on the front panel of said stand above said stop block, and a plurality of coupling rods raised from a back side wall thereof and respectively coupled to the coupling holes of said stand.

2. The computer mainframe and stand arrangement of claim 1 wherein said coupling holes of said stand each are formed of a round hole and an elongated positioning hole downwardly extended from the round hole, and said coupling rods of said computer mainframe each have a neck adapted for engaging into the elongated positioning holes of said coupling holes after insertion of said coupling rods into the round holes of said coupling holes.

3. The computer mainframe and stand arrangement of claim 1 wherein said riser of said stand has a plurality of air vents for dissipation of heat from said computer mainframe.

* * * * *